United States Patent [19]

Takami et al.

[11] Patent Number: 4,831,400

[45] Date of Patent: May 16, 1989

[54] STOP-DOWN SIGNAL ADJUSTING CIRCUIT IN AUTOMATIC APERTURE CONTROL CAMERA

[75] Inventors: Satoshi Takami; Yutaka Ohsawa, both of Tokyo, Japan

[73] Assignee: Asahi Kogaku Kogyo Kabushiki Kaisha, Tokyo, Japan

[21] Appl. No.: 77,462

[22] Filed: Jul. 24, 1987

[51] Int. Cl.[4] .............................................. G03B 7/085
[52] U.S. Cl. ................................. 354/271.1; 354/446; 354/448
[58] Field of Search ..................... 354/271.1, 446, 448, 354/455

[56] References Cited

U.S. PATENT DOCUMENTS

4,124,825 11/1978 Webb et al. ........................ 330/279
4,621,918 11/1986 Kawasaki et al. ........... 354/271.1 X Primary Examiner—Michael L. Gellner
Attorney, Agent, or Firm—Sughrue, Mion, Zinn, Macpeak and Seas

[57] ABSTRACT

The oscillation wave signal generated during lens stop-down is amplified by an adjustable gain amplifier the gain of which is controlled in accordance with the peak value of the oscillation wave signal detected during a predetermined time period, to thereby maintain a substantially constant oscillation wave signal amplitude during lens stop-down.

22 Claims, 6 Drawing Sheets

STOP-DOWN SIGNAL ADJUSTING CIRCUIT IN AUTOMATIC APERTURE CONTROL CAMERA

BACKGROUND OF THE INVENTION

1. Field of the Invention

This invention relates to a stop-down signal adjusting circuit used for a camera with an automatic aperture control mechanism.

1. Background of the Invention

A so-called "full-aperture metering system" in which light is received inside a camera to make measurements of light is extensively employed for cameras. More specifically, in such a system, a shutter speed, film sensitivity and exposure value are preset, and then a suitable aperture value is calculated from the quantity of light passed through a fully opened photographing lens. After the shutter is released, the lens is mechanically stopped down to the aperture value thus calculated.

In the metering system, it is essential that the aperture value is detected to provide a stop-down signal during the stopping down of the lens. The stop-down signal is fed back to the calculation circuit of the camera to be compared with the calculated aperture value, and the lens stopping operation is suspended upon coincidence of the two.

Means are available for detecting the lens stopping operation to produce the stop-down signal. One example is a device in which an oscillation wave signal produced in association with the lens stopping operation is converted into pulses, and the stop-down signal is outputted according to the count value of the pulses.

Figure 5:
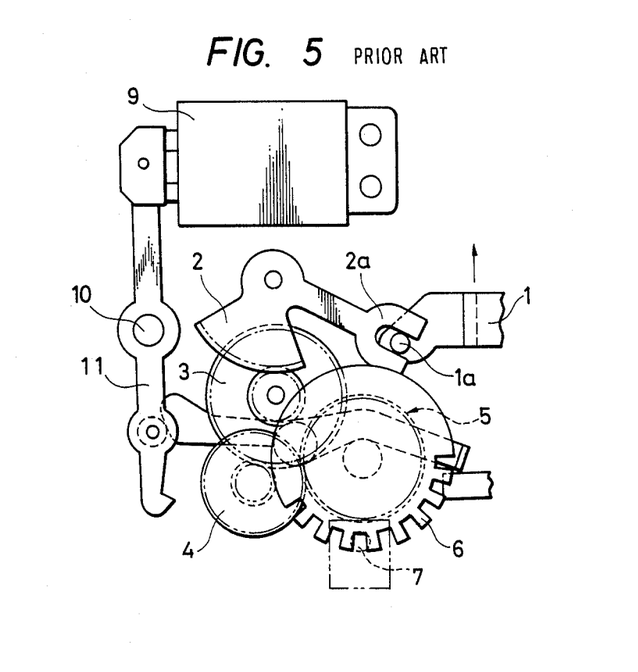
FIG. 5 is an explanatory diagram showing the arrangement of a conventional stop-down oscillation wave signal generating device in an automatic aperture control camera.
Figure 6:
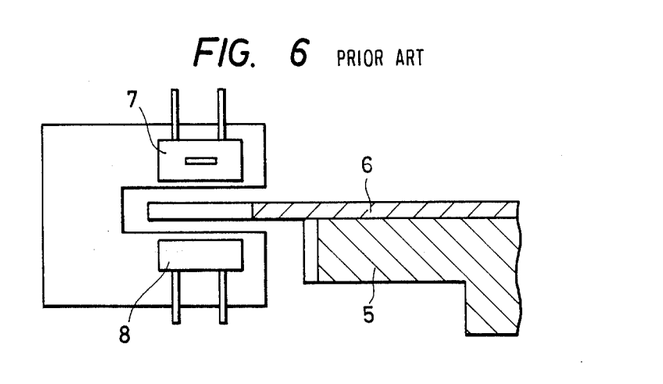
FIG. 6 is a diagram showing a photo chopper in the device of FIG. 5.

FIGS. 5 and 6 show one example of a conventional device for producing an oscillation wave signal in association with a lens stopping operation. In FIGS. 5 and 6, reference numeral 1 designates a lever operated in association with the operation of a lens stopping member. The lever 1 is moved in the direction of the arrow as the lens is stopped down. Since a pin 1a embedded in the lever is engaged with a fork-shaped portion 2a of a sector-shaped gear 2, the movement of the lever 1 turns the gear 2, which rotates an intermediate gear 3. The rotation of the gear 3 is transmitted through a gear 4 to a link gear 5 to rotate the link gear 5.

A code board 6 having a number of radially extending slits in its periphery is coaxially mounted on the gear 5. The code board 6, together with a light emitting diode 7 and a photo transistor 8 arranged on either side of the periphery of the code board 6, form a photo chopper.

Figure 7:
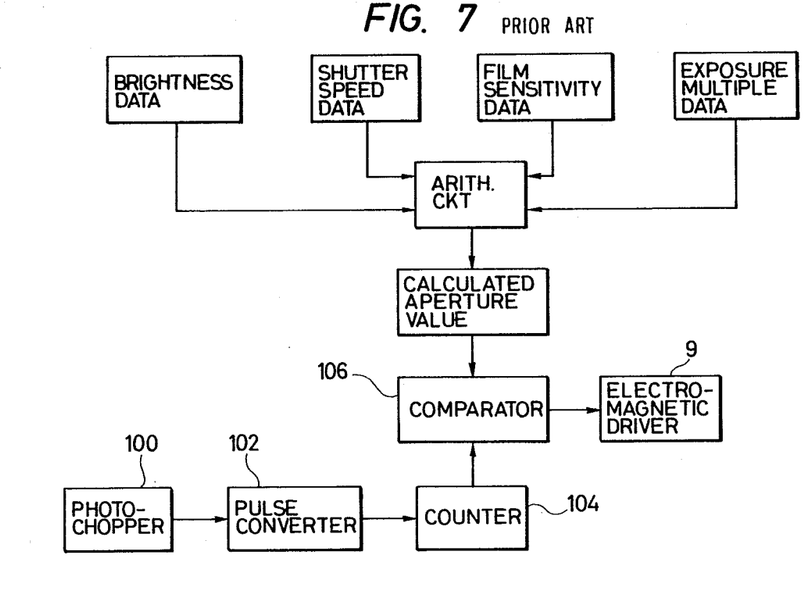
FIG. 7 is a block diagram showing the arrangement of an automatic aperture control camera.

In the conventional device thus constructed, the code board 6 is turned as the lens is stopped down, so that the photo chopper outputs an oscillation wave signal having a number of cycles corresponding to the current aperture value. As shown in a block diagram of FIG. 7, the oscillation wave signal from the photo chopper 100 is converted into a pulse signal by a pulse converter 102, and the pulses are counted by a counter 104. The count value of the counter 104 comprises a stop-down signal and is compared in comparator 106 with the calculated aperture value. When the stop-down signal coincides with the aperture value, an electromagnetic drive 9 unit is operated to suspend the stop-down operation. As shown in FIG. 5, the electromagnetic drive unit 9, when activated, turns a stop lever 11 about a pin 10 until the locking pawl of the stop lever 11 is engaged with the gear 4. As a result, the rotation of the gear 4 is stopped, and the lever 1 is also stopped simultaneously, so that the lens stopping operation is stopped in agreement with the control value.

In the above-described device, a peak value of the oscillation wave signal depends very much on the accuracy and quality of the components of the photo chopper, such as the photo transistor. This cannot be disregarded in the conversion of the oscillation wave signal into the pulse signal.

Figure 8A:
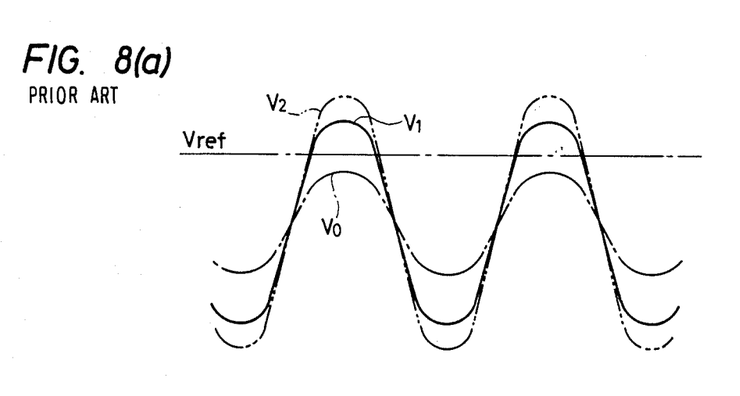
FIGS. 8(a) and 8(b) are waveform diagrams showing the conventional conversion of stop-down oscillation wave signals into pulse signals.
Figure 8B:
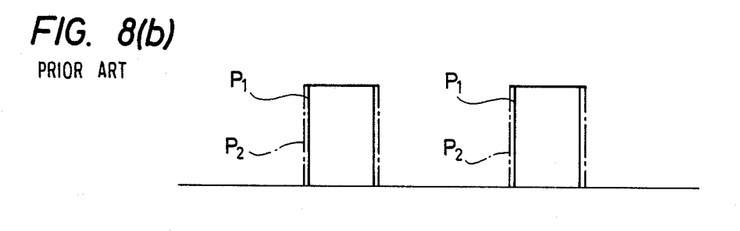

FIG. 8(a) shows oscillation wave signals $V_0$, $V_1$ and $V_2$ provided respectively when three different photo transistors are used. FIG. 8(b) shows stop-down signals, i.e., pulse $P_1$ and $P_2$, which are obtained through pulse conversion by the pulse converter 102 having a reference voltage $V_{ref}$.

As is apparent from FIGS. 8(a) and (b) in the case of the low amplitude oscillation wave signal $V_0$, the pulse conversion cannot be carried out, and the automatic aperture control cannot be performed. It is thus clear that, irrespective of the peak value of the oscillation wave signal outputted by the aperture value detecting source such as the photo chopper, the input voltage to the pulse converter must have a substantially constant peak value.

SUMMARY OF THE INVENTION

Accordingly, an object of this invention is to eliminate the above-described difficulty accompanying a conventional stop-down signal generating device.

The foregoing object of the invention is achieved by the provision of a stop-down signal adjusting circuit for an automatic aperture control camera of the type in which an oscillation wave signal corresponding to a lens stopping operation is converted into a pulse signal, and the lens stopping operation is suspended when the pulse signal is counted to a predetermined value. The adjustment circuit according to the invention comprises: an adjustable gain amplifier for amplifying the oscillation wave signal; a gain adjusting circuit for detecting the peak value of the oscillation wave signal, to control the gain of the amplifier according to the peak value thus detected; and a nonvolatile memory in which the peak value thus detected is written and from which the contents are read, so that the peak of the oscillation wave signal is adjusted in an amplification step.

In the circuit of the invention, the gain of the amplifier for amplifying the oscillation wave signal corresponding to the lens stopping operation is adjusted according to the peak value of the amplified oscillation wave signal, and therefore the output of the amplifier is set to a predetermined, substantially constant peak voltage. This output voltage is converted into pulses.

The peak value data of the amplified oscillation wave signal is maintained stored in the nonvolatile memory. Therefore, the amplifier gain, once adjusted, is automatically adjusted by the data read out of the memory. The gain adjustment can thus be accomplished during the manufacture of the camera, and no further gain adjustment is requirement.

BRIEF DESCRIPTION OF THE DRAWINGS

The invention will be more clearly understood from the following description in conjunction with the accompanying drawings, wherein.

DETAILED DESCRIPTION OF THE PREFERRED EMBODIMENT

Figure 1:
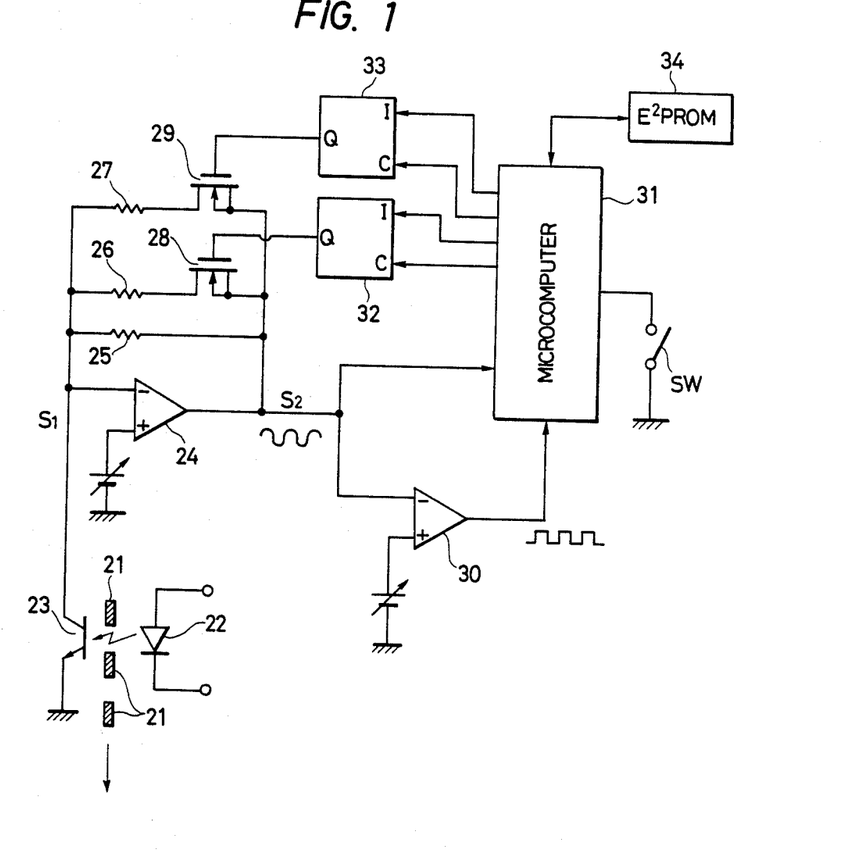
FIG. 1 is a circuit diagram showing a stop-down signal adjusting circuit according to one embodiment of the invention.

FIG. 1 shows a stop-down signal adjusting circuit according to the present invention. In FIG. 1, reference numerals 21, 22 and 23 designate a code board, a light emitting diode and a photo transistor, respectively, which form a photo chopper similar to the conventional one described before.

Reference numeral 24 designates an operational amplifier forming an inverter amplifier. The amplifier 24 has its inverting input terminal connected to the photo transistor 23 and is adapted to amplify the oscillation wave signal which corresponds to the lens stopping operation.

The operational amplifier 24 has three parallelconnected feedback resistors 25, 26 and 27. N-channel FETs 28 and 29 are provided in the feedback circuits including the resistors 26 and 27, respectively. The FETs 28 and 29 are controlled, i.e., rendered conductive or non-conductive, to change the resistances of the feedback circuits and thereby adjust the amplifier gain.

The resistance $r_1$, $r_2$ and $r_3$ of the feedback resistors 25, 26 and 27, respectively, are selected such that $r_1 > r_2 > r_3$. Therefore, the amplifier gain is at a maximum $A_1$ when both the FETs 28 and 29 are non-conductive; the gain is decreased to $A_2$ when the FET 28 is conductive while the FET 29 is non-conductive; the gain is further decreased to $A_3$ when the FET 28 is non-conductive while the FET 29 is conductive, and the gain is at a minimum value $A_4$ when both FETs 28 and 29 are conductive.

Further in FIG. 1, reference numeral 30 designates a comparator which operates as a pulse converter (or waveform shaper). The comparator 30 receives the output voltage of the operational amplifier 24 and outputs a number of pulses corresponding to the cycles of the oscillation wave signal.

The output pulses of the comparator 30 are applied to a microcomputer 31, so that counting the pulses and comparing the count value with the calculated aperture value are achieved through the microcomputer's data processing. Thus, the lens stopping operation is suspended when a suitable aperture value is reached.

On the other hand, the instantaneous value of an output voltage of the operational amplifier 24 is monitored by the microcomputer 31, which is provided with a high speed A/D (analog-to-digital) converter for detecting the peak value of the output voltage. When the peak value is detected (a peak value detecting operation being described later), the microcomputer 31 applies a set signal "1" or a reset signal "0" to flip-flop (FF) circuits 32 and 33 depending on the detected peak value.

The FF circuit 32, when set, provides an output "1" at its output terminal Q which is supplied to the gate of the FET 28 to render the FET 28 conductive. The FF circuits 33 controls the FET 29 in a similar manner.

The peak value detected by the microcomputer 31 is written in a nonvolatile memory, e.g., an electronically erasable programmable read-only memory (EEPROM or E²PROM) 34 according to the program of the microcomputer 31. The data stored in the E²PROM 34 is read out after the amplifier gain is adjusted through the initial adjustment. According to the peak value of the data thus read out, the microcomputer 31 sets or resets the FF circuit 32 and 33 similarly as in the above described case. The above-described amplifier gain initial ajustment is carried out by turning on a change-over switch SW. The switch is closed during the production of the camera., and after the adjustment it is held open.

The operation of the adjustment circuit will now be described.

First, the change-over switch SW is closed to place the microcomputer in an initial adjustment mode. When the switch SW is closed in this manner, both the FF circuits 32 and 33 are reset, and FETs 28 and 29 are rendered non-conductive, with the result that the gain of the operational amplifier 24 is set to $A_1$ in correspondence to the resistance $r_1$ of the feedback register 25. The resistance $r_1$ of resistor 25 is determined according to the resolution of the A/D converter provided for the microcomputer 31.

When, under this condition, the camera shutter release is operated, the oscillation wave signal $S_1$ produced by the photo chopper is applied to the operational amplifier 24, where it is amplified into an oscillation wave signal $S_2$ which comprises the oscillation wave signal.

Figure 2:
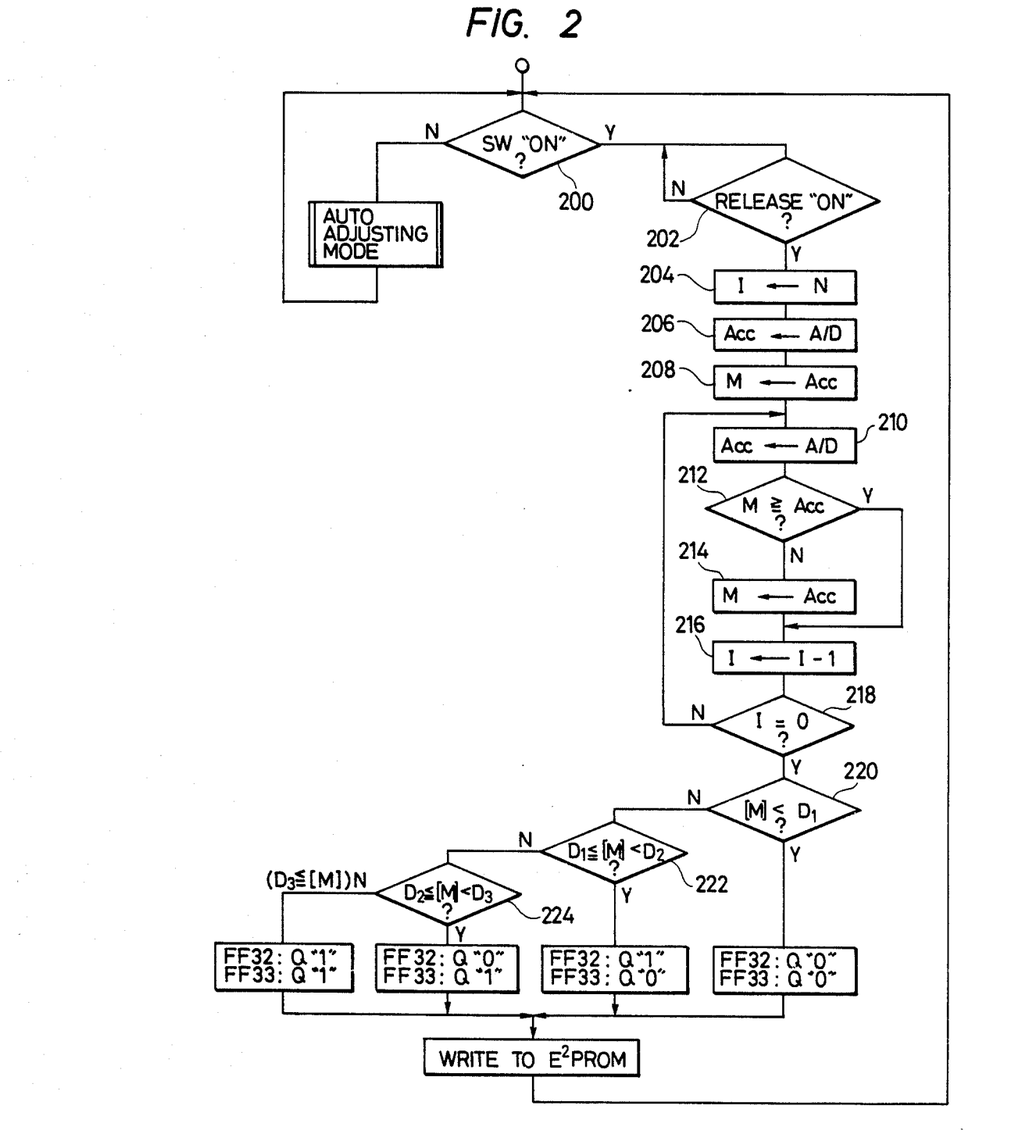
FIG. 2 is a flow chart for the description of the operation of the microcomputer and peripheral circuits in the adjusting circuit shown in FIG. 1.

The signal $S_2$ is monitored by the microcomputer 31, and its peak value is detected as indicated in a flow chart of FIG. 2.

In the microcomputer 31, three different reference level data $D_1$, $D_2$ and $D_3$ are preset, so that the peak value detected by the computer 31 is compared with these reference level data. That is the following comparisons are carried out:

$VS_2 < D_1$ $D_1 \leq VS_2 < D_2$ $D_2 \leq VS_2 < D_3$ $D_3 \leq VS_2$ where $VS_2$ is the peak value detected.

According to the results of the comparisons described above, the microcomputer 31 sets or resets the FF circuits 32 and 33 as follows;

(1) When $VS_2 < D_1$, both FF circuits 32 and 33 are reset, and FETs 28 and 29 are rendered non-conductive. Therefore, the amplifier gain is set to $A_1$.

(2) When $D_1 \leq VS_2 < D_2$, FF circuits 32 is set while FF circuit 33 is reset, and therefore FET 28 is rendered conductive while FET 29 is rendered non-conductive. Accordingly, the amplifier gain is set to $A_2$.

(3) When $D_2 \leq VS_2 < D_3$, FF circuit 32 is reset while FF circuit 32 is set, and therefore FET 28 is rendered non-conductive. Accordingly, the amplifier gain is set to $A_3$.

(4) When $D_3 \leq VS_2$, both FF circuits 32 and 33 are set, and therefore, both FETs 28 and 29 are rendered conductive. Accordingly, the amplifier gain is set to $A_4$.

Since the gain of the amplifier is adjusted in a negative feedback mode in response to the peak value of the oscillation wave signal $S_2$, the peak value of the signal $S_2$ is held substantially at a predetermined constant value. The predetermined peak value can be obtained by suitably selecting the resistances of the feedback resistors 25, 26 and 27 of the operational amplifier 24.

Irrespective of the peak value of the oscillation wave signal $S_1$ outputted by the photo chopper, the oscillation wave signal $S_2$ subjected to peak adjustment as described above is positively converted into a pulse signal by the comparator 30. The pulse signal is then supplied to the microcomputer 31.

After the initial adjustment has been accomplished, the switch SW is opened, and it is maintained open. On the other hand, since the peak value thus detected and data on the decision of the magnitude of the peak value have been written in the E$^2$PROM 34, each time the camera shutter release is operated after the initial adjustment the contents of the E$^2$PROM 34 are read out by the microcomputer 31. As a result, similarly as in the above described case, the peak value of the oscillation wave signal $S_2$ is adjusted.

The contents of the E$^2$PROM 34 will not be erased even if the power source is disconnected from the camera. Therefore, the initial adjustment is required only once during the manufacture of the camera.

The detection of the peak value and the decision as to the magnitude of the peak value by the microcomputer will now be described with reference to the flow chart of FIG. 2.

The number of times N which the high-speed A/D converter in the microcomputer 31 will sample the oscillation wave signal has been programmed in advance. As described above, the microcomputer 31 is placed in the initial adjustment mode by turning on the change-over switch SW, and it is a placed in the automatic adjustment mode by turning off the switch SW. The status of the switch SW is detected at step 200 in FIG. 2. In this connection, it should be noted that the output terminals Q of the FF circuits 32 and 33 are changed to "0" when the switch Sw is turned on.

When the camera shutter release is operated in the initial adjustment mode, the CPU of the microcomputer 31 detects the shutter release at step 202 and operates at step 204 to set the aforementioned number N into a register I, and at step 206 to store in an accumulator Acc the conversion data which the A/D converter produces by subjecting the oscillation wave signal $S_2$ to A/D conversion. At step 208, the microcomputer writes the contents of the accumulator Acc in a memory M.

Conversion data corresponding to the next sample outputted by the A/D converter is stored in the accumulator Acc at step 210, and the content of the accumulator Acc is compared at step 212 with the content of the memory M. When it is detected that the new conversion data is larger than what has already been stored in the memory M, the new conversion data is written into the memory M in place of the old data at step 214. The repetition number data in the register I is then decreased by one ($-1$) at step 216, and at step 218 it is determined whether or not the repetition number now stored in the register I is zero. If the I$\neq$0, then the process returns to step 210 for examination of the next sample from the A/D converter.

Whenever it is detected at step 212 that the value already stored in the memory M is later than the new conversion data from the A/D converter, the step of replacing the memory data is omitted, and the operation instead advances from step 212 to step 216 for decreasing the repetition data in the register I by one.

The storage of the conversion data in the accumulator, the replacement of the content of the memory M, and the comparison of the content of the accumulator with the content of the memory M are repeatedly carried out in the above-described manner until the number of repetitions remaining reaches zero (I=0). At the end of this process, the value stored in the memory M will correspond to the detected peak value of the oscillation wave signal $S_2$. The memory content (M) is then compared with the reference level data $D_1$, $D_2$ and $D_3$ at steps 220, 222 and 224, respectively, to determined the magnitude of the peak value.

The magnitude of the peak values determined as described above. According to this determination, the FF circuits 32 and 33 are set or reset.

Figure 3:
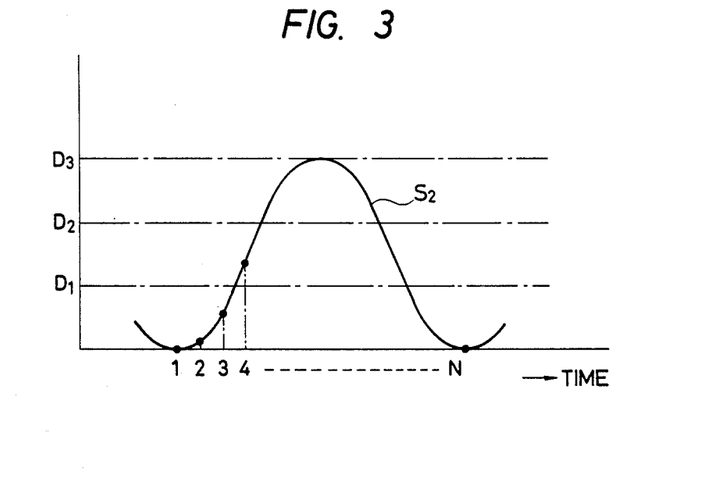
FIGS. 3 and 4 are diagrams showing an oscillation wave signal corresponding to a lens stopping operation and the number of samples from a high speed A/D converter which may be examined in a peak detection operation.
Figure 4:
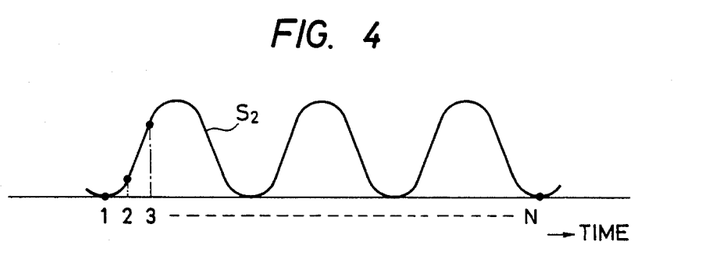

The number N of samples to be examined from the A/D converter may be so determined that the oscillation wave signal $S_2$ is quantized for one complete cycle as shown in FIG. 3, or for several cycles as shown in FIG. 4.

In the above-described embodiment, three feedback resistors are provided for the operational amplifier 24. However, the invention is not limited thereto or thereby. That is, the number of feedback resistors may be increased or decreased as desired. In this modification, the circuit should be so designed that reference level data are provided for the microcomputer 31 in correspondence to the number of feedback resistors, which are selectively operated.

As described above, in the stop-down signal adjusting circuit of the present invention, an excessively large or small peak of the oscillation wave signal outputted by the aperture value detecting source such as a photo chopper is adjusted to a subtantially constant predetermined value in the amplification step. Therefore, the oscillation wave signal can be positively converted into a pulse signal regardless of the characteristics or qualities of the components of the aperture value detecting source. Thus, an automatic aperture control mechanism which is stable in operation and high in reliability can be provided according to the invention.

The invention is further advantageous in that, since the adjustment of the stop-down signal adjusting circuit is accomplished through data processing by the microcomputer in the manufacture of the camera, the adjustment can be accurately achieved by an extremely simple operation.

What is claimed is:

1. A stop-down signal adjusting circuit for use in a camera in which an oscillation wave signal is generated corresponding to a lens stopping operation, said stop-down signal adjusting circuit comprising:
    an adjustable gain amplifier for amplifying said oscillation wave signal with a gain adjustable in accordance with a gain control signal; and
    gain adjusting means for detecting a peak value of said oscillation wave signal and for detecting said gain control signal in accordance with the detected peak value.

2. A circuit as claimed in claim 1, in which said adjustable gain amplifier comprises a feedback amplifier having a plurality of feedback resistors selectable in accordance with said gain control signal.

3. A stop-down signal adjusting circuit for use in a camera in which an oscillation wave signal is generated corresponding to a lens stopping operation, said stop-down signal adjusting circuit comprising:

an adjustable gain amplifier for amplifying said oscillation wave signal with a gain adjustable in accordance with a gain control signal; and gain adjusting means for detecting a peak value of said oscillation wave signal and for generating said gain control signal in accordance with the detected peak value, wherein said gain adjusting means detects said peak value during a predetermined time period, said circuit further comprising nonvolatile memory means for storing said detected peak value and means for generating said gain control signal in accordance with the stored peak value during operation of said camera subsequent to said predetermined time period.

4. A circuit as claimed in claim 3, wherein said nonvolatile memory comprises an $E^2PROM$.

5. A circuit as claimed in claim 3 further comprising a change-over switch, said switch being closed to store said gain control signal in said nonvolatile memory means, whereafter said switch is opened and maintained open, and said gain adjusting means operates to adjust the gain according to said stored gain control signal.

6. A circuit as claimed in claim 5, wherein said nonvolatile memory is an $E^2PROM$.

7. A circuit as claimed in claim 5, wherein the storing operation is carried out during manufacturing of the camera.

8. A stop-down signal adjusting circuit for use in a camera in which an oscillation wave signal is generated corresponding to a lens stopping operation, said stop-down signal adjusting circuit comprising:

an adjustable gain amplifier for amplifying said oscillation wave signal with a gain adjustable in accordance with a gain control signal; and gain adjusting means for detecting a peak value of said oscillation wave signal and for generating said gain control signal in accordance with the detected peak value, wherein said gain adjusting means comprises means for sampling said oscillation wave signal a plurality of times over a predetermined period of time, and means for detecting the maximum value of any one of said samples.

9. A circuit as claimed in claim 8, wherein the duration of said predetermined period of time is at least substantially equal to a single cycle of said oscillation wave signal.

10. A circuit as claimed in claim 8, wherein the duration of said predetermined period of time is equal to at least a plurality of cycles of said oscillation wave signal.

11. An automatic aperture control camera of the type including means for generating an oscillation wave signal produced by a photochopper, which corresponds to a lens stopping operation, means for counting cycles of said oscillation wave signal, and means for suspending the lens stopping operation when the counted number of cycles reaches a predetermined value, said camera further comprising:

an adjustable gain amplifier for amplifying said oscillation wave signal with a gain adjustable in accordance with a gain control signal; and gain adjusting means for detecting a peak value of said oscillation wave signal and for generating said gain control signal in accordance with the detected peak value.

12. A camera as claimed in claim 11, in which said adjustable gain amplifier comprises a feedback amplifier having a plurality of feedback resistors selectable in accordance with said gain control signal.

13. A camera as claimed in claim 11, wherein said gain adjusting means detects said peak value during a predetermined time period, said camera further comprising means for generating said gain control signal in accordance with the detected peak value during operation of said camera subsequent to said predetermined time period and nonvolatile memory means for storing said gain control signal.

14. A camera as claimed in claim 13, wherein said nonvolatile memory comprises and $E^2PROM$.

15. A camera as claimed in claim 13 further comprising a change-over switch, said switch being closed to store said gain control signal in said nonvolatile memory means, whereafter said switch is opened and maintained open, and said gain adjusting means operates to adjust the gain according to said stored gain control signal.

16. A camera as claimed in claim 15, wherein said nonvolatile memory is an $E^2PROM$.

17. A camera as claimed in claim 15, wherein the storing operation is carried out during manufacturing of the camera.

18. An automatic aperture control camera of the type including means for generating an oscillation wave signal corresponding to a lens stopping operation, means for counting cycles of said oscillation wave signal, and means for suspending the lens stopping operation when the counted number of cycles reaches a predetermined value, said camera further comprising:

an adjustable gain amplifier for amplifying said oscillation wave signal with a gain adjustable in accordance with a gain control signal; and gain adjusting means for detecting a peak value of said oscillation wave signal and for generating said gain control signal in accordance with the detected peak value, wherein said means for counting comprises means for converting the output of said adjustable gain amplifier to pulse signals, and means for counting said pulse signals.

19. An automatic aperture control camera of the type including means for generating an oscillation wave signal corresponding to a lens stopping operation, means for counting cycles of said oscillation wave signal, and means for suspending the lens stopping operation when the counted number of cycles reaches a predetermined value, said camera further comprising:

an adjustable gain amplifier for amplifying said oscillation wave signal with a gain adjustable in accordance with a gain control signal; and gain adjusting means for detecting a peak value of said oscillation wave signal and for generating said gain control signal in accordance with the detected peak value, wherein said gain adjusting means comprises means for sampling said oscillation wave signal a plurality of times over a predetermined period of time, and means for detecting the maximum value of any one of said samples.

20. A circuit as claimed in claim 19, wherein the duration of said predetermined period of time is at least substantially equal to a single cycle of said oscillation wave signal.

21. A circuit as claimed in claim 19, wherein the duration of said predetermined period of time is equal to at least a plurality of cycles of said oscillation wave signal.

22. An automatic aperture control camera of the type including means for generating an oscillation wave signal produced by a photochopper, which corresponds to a lens stopping operation, means for counting cycles of said oscillation wave signal, and means for suspending the lens stopping operation when the counter number of cycles reaches a predetermined value, said camera further comprising:

means for storing a gain control signal for a gain adjustable amplifier amplifying said oscillation wave signal; and gain adjusting means for adjusting the gain of said amplifier according to said stored gain control signal.

* * * * *